(12) United States Patent
Yoo et al.

(10) Patent No.: US 6,394,523 B1
(45) Date of Patent: May 28, 2002

(54) PORTABLE ENCLOSURE FOR SEMICONDUCTOR PROCESSING

(75) Inventors: Woo Sik Yoo, Palo Alto; Taro Yamazaki, San Jose, both of CA (US)

(73) Assignee: WaferMasters Inc., San Jose, CA (US)

( * ) Notice: Subject to any disclaimer, the term of this patent is extended or adjusted under 35 U.S.C. 154(b) by 0 days.

(21) Appl. No.: 09/653,920

(22) Filed: Sep. 1, 2000

(51) Int. Cl.⁷ .................................................. B60P 3/00
(52) U.S. Cl. ..................................................... 296/24.1
(58) Field of Search ........................... 296/24.1; 454/187

(56) References Cited

U.S. PATENT DOCUMENTS

| | | | |
|---|---|---|---|
| 4,267,769 A | * 5/1981 | Davis et al. | |
| 4,409,889 A | * 10/1983 | Burleson | |
| 4,667,580 A | 5/1987 | Wetzel | 98/34.6 |
| 4,787,297 A | * 11/1988 | Johnson | 454/187 |
| 4,850,268 A | 7/1989 | Saito et al. | 98/33.1 |
| 4,909,557 A | 3/1990 | De Weck et al. | 296/24.1 |
| 5,627,105 A | * 5/1997 | Delfino et al. | |
| 6,303,906 B1 | * 10/2001 | Yoo | 219/390 |

OTHER PUBLICATIONS

Sandia Corporation Lab News, Jan. 5, 1962, copy in class 454, subclass 187.*

* cited by examiner

*Primary Examiner*—Dennis H. Pedder
(74) *Attorney, Agent, or Firm*—Skjerven Morrill LLP; Theodore P. Lopez

(57) ABSTRACT

A system and method for using a portable enclosure system for conducting on-site demonstrations of semiconductor processing operations or as a temporary clean room. A vehicle transports an environmentally-controlled enclosure including a semiconductor processing workspace, preparation area, and entrance area, from a first location to a second location. An air suspension device and trailer are included in one embodiment. Air suspension devices and an enclosed truck are included in another embodiment. In yet another embodiment, the environmentally-controlled enclosure system includes a viewing mechanism, which allows for visual inspection of the internal portion of the enclosure from outside of the controlled environment, especially advantageous during demonstrations.

16 Claims, 7 Drawing Sheets

PORTABLE ENCLOSURE FOR SEMICONDUCTOR PROCESSING

BACKGROUND OF THE INVENTION

1. Field of the Invention

The invention is related to semiconductor processing, and more particularly, to an enclosure transportable on a vehicle, which may be used for demonstrations of processing operations in a clean room environment or as a temporary clean room at selected locations.

2. Description of the Related Art

As the semiconductor industry and other high technology industries rapidly grow, so does the need for "clean room" space. Clean rooms are enclosed work areas in which the environment is strictly controlled for temperature, pressure, humidity, and particulate level. Most clean rooms are built on-site or are prefabricated for installation on-site. The conventional footprint and power consumption requirements for most clean rooms used in the semiconductor industry are too large to permit economic portability of fully-functional clean rooms. For example, semiconductor processes can require large amounts of circulating air, cooling water, and process gases. Typically, circulating these substances requires several pumps and large amounts of power. A conventional semiconductor clean room can use between three and six pumps, can require about 250 KW of power, can use up to 30 gallons per minute of cooling water, and can use many process gases, some of which are toxic and/or flammable. These requirements have made a fully-functional, permanently-mobile clean room, transported by a vehicle, cost and size prohibitive.

For these reasons, what is needed is a fully contained, transportable clean room which is space and energy-efficient for on-site semiconductor processing demonstrations as well as for providing temporary contamination-free workspace.

SUMMARY OF THE INVENTION

The present invention provides a system and method for using a portable enclosure system for conducting operations and/or demonstrations of semiconductor processes at selected locations. The portable enclosure system includes an environmentally-controlled enclosure, which is self-contained and provides all of the functions and amenities of a conventional clean room. Advantageously, the environmentally-controlled enclosure can be transported substantially fully operational, from a first location, typically the assembly site, to a second location, typically a demonstration or work site.

The environmentally-controlled enclosure system includes a vehicle for transporting an enclosure. Once the enclosure arrives at a demonstration or work site, it can be fully operational with minimal or no set-up required. In another embodiment, the environmental enclosure system includes a viewing mechanism, which allows for visual inspection of the internal clean room portion of the enclosure from outside of the controlled environment. Thus, operational demonstrations of processing equipment performance can be viewed from outside of the enclosure.

In one aspect of the present invention, a portable enclosure system is provided which includes an environmentally-controlled enclosure. The environmentally-controlled enclosure defines a workspace for conducting semiconductor wafer processing operations. The environmentally-controlled enclosure is transported on a vehicle from a first location to a second location.

In another aspect of the present invention, a clean room transportation system is provided. The system includes an environmentally-controlled enclosure defining a workspace, and including a semiconductor processing tool. A viewing mechanism is formed on a side wall of the environmentally-controlled enclosure, which allows visual access to the workspace from outside of the environmentally-controlled enclosure. The system also includes a vehicle for transporting the environmentally-controlled enclosure from a first location to a second location.

In yet another aspect of the present invention, a method is provided for providing an environmentally-controlled enclosure system at any selected location. The method includes providing an environmentally-controlled enclosure, which defines a workspace having a semiconductor processing tool, and transporting the environmentally-controlled enclosure from a first location to a second location.

In another aspect of the present invention, a method is provided for demonstrating a semiconductor processing tool at any selected location. The method includes providing an environmentally-controlled enclosure, which defines a workspace having a semiconductor processing tool; transporting the environmentally-controlled enclosure from a first location to a second location; and viewing the workspace through a viewing mechanism from a position outside of the environmentally-controlled enclosure.

The portable enclosure system of the present invention is simple in design, inexpensive to manufacture, rugged in construction, easy to transport, and efficient in operation. Additional advantages of the portable clean room include being pre-assembled and pre-tested.

These and other features and advantages of the present invention will be more readily apparent from the detailed description of the embodiments set forth below taken in conjunction with the accompanying drawings.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The present invention provides a portable, environmentally-controlled enclosure system. The system includes an environmentally-controlled enclosure, commonly referred to as a "clean room." As described in detail below, the clean room is fully functional and provides a working environment for processing semiconductor wafers. Although any type of semiconductor processing may be conducted in the clean room, it should be understood that the size of the processing equipment for use in the present invention should be scalable to fit within the clean room of the present invention and be fully operational. The vehicle used for transporting the clean room can be a conventional vehicle modified to support the clean room and supporting equipment.

Figure 1A:
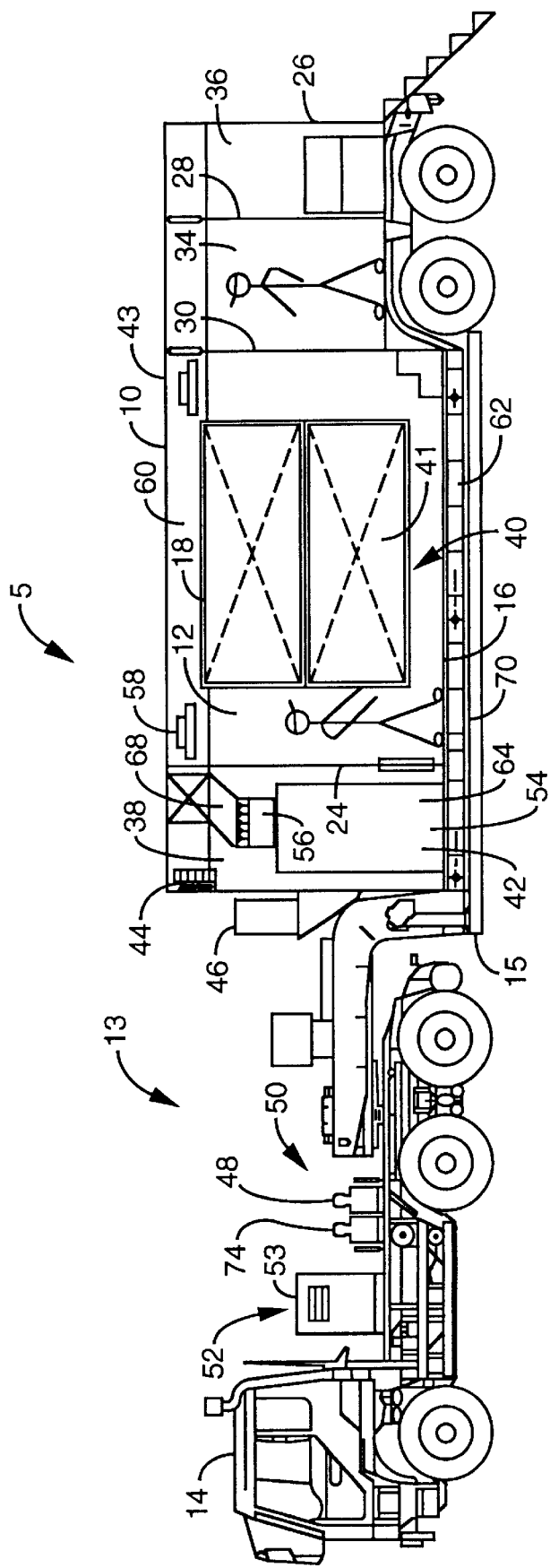
FIGS. 1A and 1B are simplified side and top elevation views, respectively, of an embodiment of the portable environmentally-controlled enclosure system of the present invention.
Figure 1B:
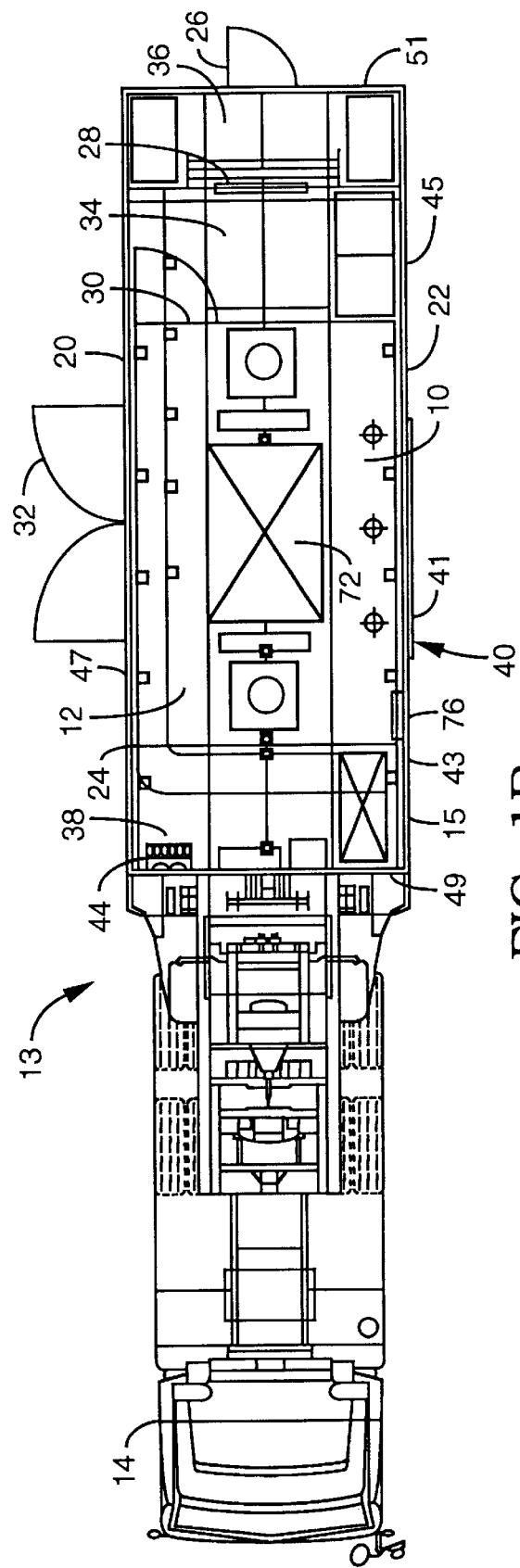

FIGS. 1A and 1B are simplified side and top elevation views, respectively, of an embodiment of environmentally-controlled enclosure system 5 of the present invention. Environmentally-controlled enclosure system 5 includes an environmentally-controlled enclosure 10, which defines a workspace 12. Enclosure system 5 also includes a vehicle 13 for transporting environmentally-controlled enclosure 10 from a first location to a second location for on-site demonstrations of semiconductor processors or to provide temporary clean room workspace.

In one embodiment, vehicle 13 includes a truck 14 and a trailer 15. Truck 14 may be any conventional truck used for hauling and transporting items. Truck 14 can have engines rated from between about 250 HP to about 650 HP. The set-forward or set-back axles of truck 14 may be rated up to about 23,000 lbs. The rear axles may be rated up to about 65,000 lbs. One example of a truck 14, with no intent to limit the invention thereby, is a Peterbilt Model 357, available from Redwood Reliance Peterbilt, Eureka, Calif. It should be noted that a variety of modifications may be necessary to ensure that truck 14 is capable of hauling enclosure system 5, such as modifications to the wheel base, the trailer mount, the wheel configurations, and the engine, all of which are well-known modifications commonly made to trucks in the equipment hauling industry. As such, all modifications, if required, will in no way interfere with truck 14 complying with applicable state, federal, and, where applicable, foreign highway safety and bridge laws.

Truck 14 is operatively connected to trailer 15, on which can be placed the majority of, or substantially all, of the remaining components of environmentally-controlled enclosure system 5. Trailer 15 may be any type of conventional trailer, for example, trailer 15 may be a flat deck, step deck, or double-drop trailer, having a tandem or tri-axle unit. Trailer 15 has a payload capacity capable of carrying the remaining components of environmentally-controlled enclosure system 5. Accordingly, in one embodiment, the payload capacity of vehicle 13 may range from about 70,000 lbs. to about 120,000 lbs. Some examples of trailers suitable for use in the present invention, with no intent to limit the invention thereby, are Models TKLCS, TKCD, TKCF, and the MDG Series, available from an authorized dealer of Trail King Industries. It should be noted that a variety of modifications may be necessary to ensure that trailer 15 is capable of supporting remaining components of environmentally-controlled enclosure system 5, such as modifications to the suspension, platform framework, and wheel configuration. These modifications will not interfere with trailer 15 complying with applicable state, federal, and, where applicable, foreign highway safety and bridge laws In one embodiment, an air suspension device 70 can be mounted on trailer 15 to provide stability for environmentally-controlled enclosure 10. Air suspension devices used to provide stability are well-known in the cargo shipping industry. Air suspension devices suitable for use in the present invention are available from Nittsu Shoji Co., Tokyo, Japan, for example.

Mounted on trailer 15 and air suspension device 70 is a trailer housing 43, having two sidewalls 45 and 47 (FIG. 1B), a front wall 49 and a rear wall 51. In one embodiment, trailer housing 43 includes a plurality of spaces, enclosures, and/or work areas, including, environmentally-controlled enclosure 10, preparation area 34, entrance area 36, and equipment space 38. Housing walls 45, 47, 49, and 51 provide an airtight barrier or shell between the external environment and the work areas and spaces of the present invention enclosed therein. Alternatively, the workspaces and areas of the present invention may be fabricated as modular sections or enclosures, which can be assembled together to form trailer housing 43.

The work areas and spaces can be kept environmentally separated from each other and the external environment using airtight doors. For example, an external door 26 provides access to entrance area 36. Access door 28 provides access from entrance area 36 to preparation area 34. Access door 30 provides access from preparation area 34 to workspace 12. A fourth door 32, preferably a double door, is formed into either sidewall 45 or sidewall 47 to provide an ingress/egress for equipment and the like into trailer housing 43. An equipment space 38 is disposed proximate to front wall 24 and may have an internal access door either provided on front wall 24 or an external access door provided on front wall 49, or both. In one embodiment, equipment space 38 can be used to house recirculating air conditioning unit 42 (FIG. 1A), supply air fan 44, and return air duct 68. In other embodiments, other necessary equipment may be positioned in equipment space 38, as needed.

In the embodiment illustrated in FIG. 1A, power supply 52, pump system 50 with process gases 74 and cooling water 48, supply air conditioning unit 46, and other environmental control devices are provided to operatively service environmentally-controlled enclosure 10. Preferably, power supply 52, pump system 50 with process gases 74 and cooling water 48, and supply air conditioning unit 46 are disposed external to trailer housing 43, either mounted external to trailer housing 43 or disposed on another portion of vehicle 13.

In one embodiment, power supply 52 can be a stand-alone generator 53. Preferably, the power capacity of generator 53 may range between about 15 KW to about 50 KW. Examples of generator 53 for use in the present invention are Model AG20S-2, available from Yanmar Diesel Engine Co., Japan, and Perkins Series diesel generators, available from Americas Generators, Miami, Fla. In this embodiment, power supply 52 is positioned outside of environmentally-controlled enclosure 10 and away from air suspension device 70, so as to insulate enclosure 10 from the vibration and noise emanating from power supply 52.

Figure 2A:
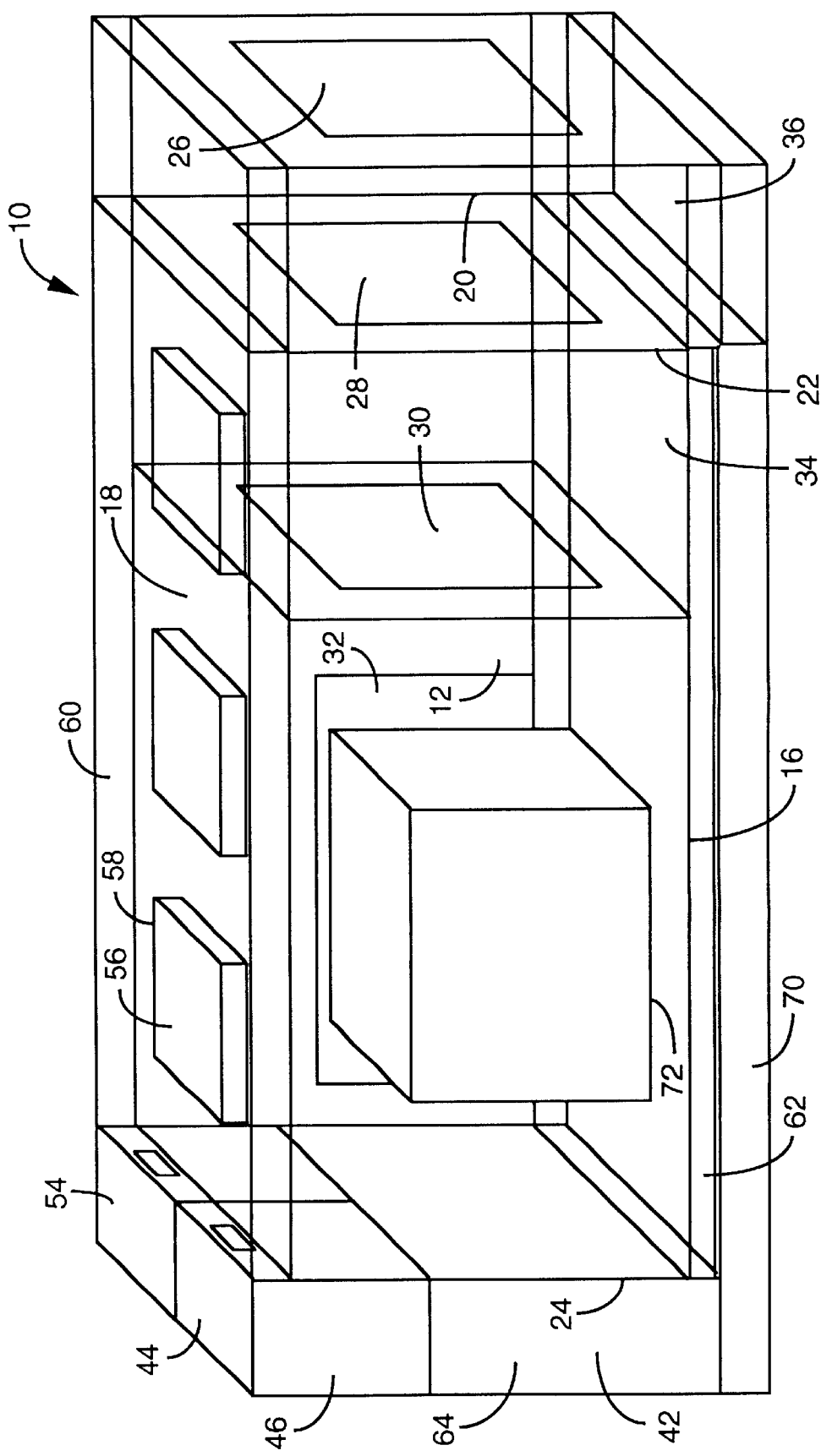
FIGS. 2A and 2B are simplified schematic views of the portable clean room enclosure and the airflow in the portable clean room enclosure, respectively.

FIG. 2A is a simplified schematic view of environmentally-controlled enclosure 10. Environmental control devices shown in FIG. 2A include air conditioning units, air humidifying device 54, particle filtration device 56, and air circulation device 58. Air conditioning units include supply air conditioning unit 46 and recirculating air conditioning unit 42. Supply air conditioning unit 46 is an upstanding, self-contained unit which is in communication with ceiling airflow channel 60 (FIGS. 1A and 2A) to supply fresh air for environmentally-controlled enclosure 10. One suitable supply air conditioning unit 46 is Model SRJ150PAKH, available from Daikin Industries, Ltd., Japan. Recirculating air conditioning unit 42 is an upstanding, self-contained unit which is in communication with floor airflow channel 62 to condition the air for recirculation. Recirculating air conditioning unit 42 includes heat pump 64 and air humidifying device 54, such as a moisturizer with air heater. One example of a suitable recirculating air conditioning unit 42 is the Dual Channel Chiller, available from Affinity Industries, Inc., Ossipee, N.H. In one embodiment, particle filtration device 56 includes HEPA filters, and air circulation device 58 includes fan units. One example of a suitable particle filtration device 56 is Model PFT0612-20R, available from Nippon Muki Co., Ltd. Suitable air circulation devices 58 include supply and exhaust fan units available from Quietaire, Houston, Tex.

Figure 2B:
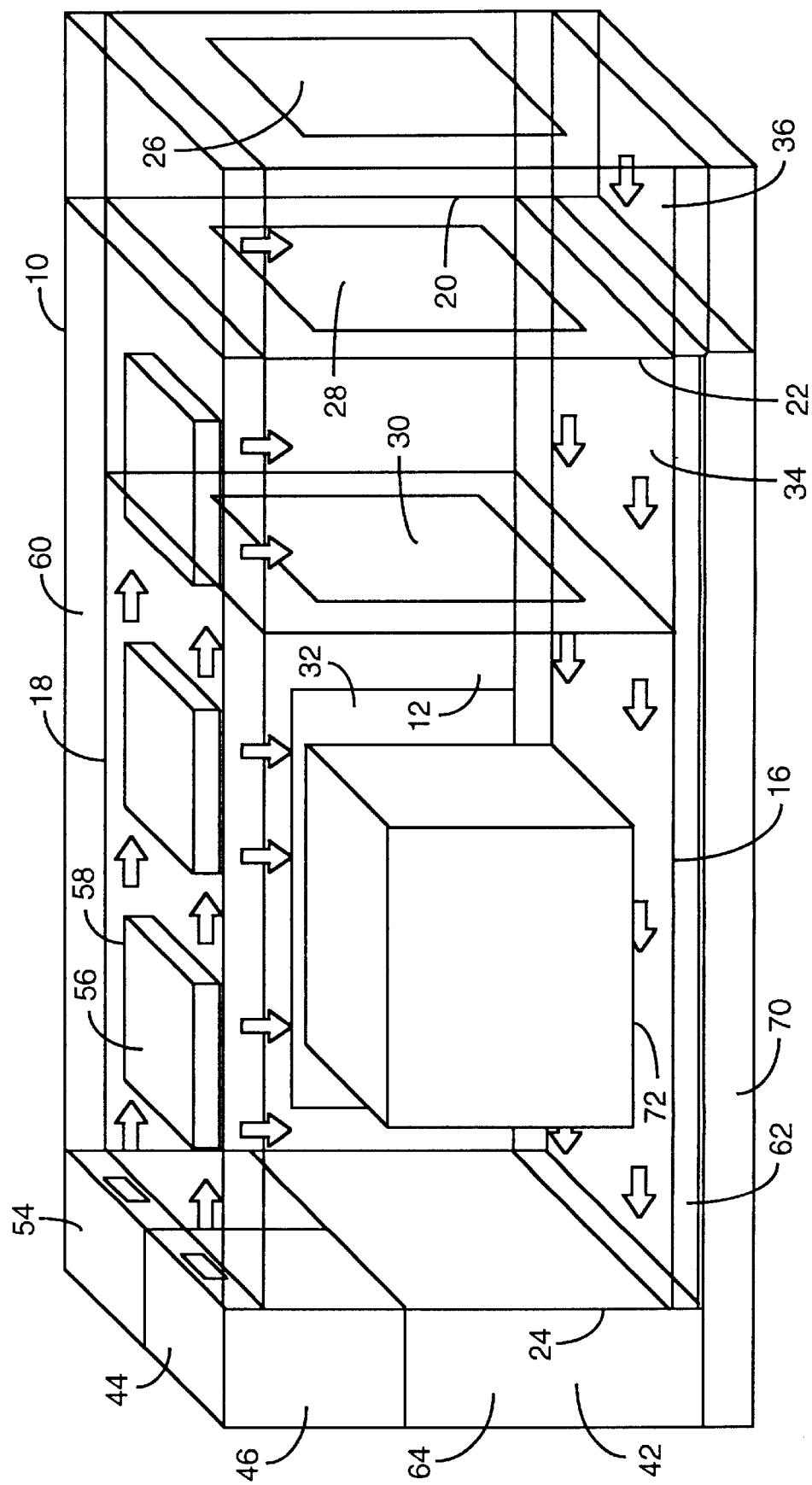

Pump system 50 circulates process gases 74 (FIG. 1A) and cooling water 48. Process gases 74 may be non-flammable, non-toxic, or inert, such as nitrogen, oxygen, and argon. In one embodiment, process gases 74 can be both non-flammable and non-toxic to comply with applicable state, federal, and where applicable, foreign safety laws. In an alternative embodiment, if flammable or toxic gases are needed, they can be separately supplied from sources outside of enclosure system 5 at the site where environmentally-controlled enclosure 10 is to be used. Process cooling water 48 is pumped between about 1 gallon and about 2 gallons per minute, a considerable improvement over the conventional rate of between 3 and 6 gallons per minute. The improved cooling water rate of this embodiment is due to lower power consumption and accordingly smaller heat generation and loss from semiconductor processing tool 72 (FIGS. 1B, 2A, and 2B). In other embodiments, cooling water 48 is eliminated when no cooling water is required for operation of processing tool 72. In one embodiment, pump system 50 with process gases 74 and cooling water 48 is located near power supply 52 on truck 14, as shown in FIG. 1A. In this embodiment, pump system 50 with process gases 74 and cooling water 48 is positioned outside of environmentally-controlled enclosure 10 and away from air suspension device 70, so as to insulate environmentally-controlled enclosure 10 from vibration.

In one embodiment, an audio system 76 may be utilized throughout environmentally-controlled enclosure system 5 (FIG. 1A) for communication between the different areas of the system and for communication between the interior and the exterior of environmentally-controlled enclosure 10.

FIG. 2B is a simplified schematic view of the airflow in environmentally-controlled enclosure 10. Environmentally-controlled enclosure 10 is maintained as a semiconductor processing "clean room," including floor 16, ceiling 18, sidewalls 20 and 22, and front wall 24, which together define workspace 12. Floor 16 and ceiling 18 include channels for the circulation of air through environmentally-controlled enclosure 10. Floor 16 includes a sheet metal bottom and sheet metal sidewalls that are formed together to create a sealed box-like receptacle that serves as airflow channel 62. In one embodiment, perforated tiles can be spaced above the bottom of the floor unit and supported by steel strips and truss-like members. Ceiling 18, like floor 16, includes a top panel to which are formed sidewalls in an airtight manner to define hollow airflow channel 60. Particle filtration devices 56 and air circulation devices 58 are spaced below the top panel.

As shown in FIGS. 2A and 2B, supply air conditioning unit 46 is in communication with ceiling airflow channel 60. Supply air fan 44 directs the air conditioned supply air into ceiling airflow channel 60. Air circulation devices 58 then draw the air through ceiling airflow channel 60, through particulate filtration devices 56, and down into environmentally-controlled enclosure 10. Because the air is under positive static pressure, the air flows downward through the room in a vertical laminar flow. At the bottom of environmentally-controlled enclosure 10, the air passes through the perforated floor tiles and into floor airflow channel 62, drawn by the recirculating air conditioning unit 42. The air is then circulated through air humidifying device 54 and through recirculation prefilters. From there, the recirculated air passes into return air duct 68 (FIG. 1A), which directs the air upwardly to the intake side of air circulation devices 58.

After the air passes through return air duct 68 to the intake side of air circulation devices 58, it is combined with a certain amount of conditioned supply air, which is needed to maintain room pressurization after losses from room exhaust and leakage. This combined airflow is then circulated through environmentally-controlled enclosure 10. In operation, the combination of conditioned supply air and recirculating air are continuously blown through the interior of environmentally-controlled enclosure 10. Any residual dust in the beginning of operation will be captured by filters 56 and thus will be purged in a short interval of time.

The temperature of the air leaving supply air conditioning unit 46 and recirculating air conditioning unit 42 controls the temperature in environmentally-controlled enclosure 10. A sensor, located in ceiling airflow channel 60, transmits a signal to a systems controller which can then set appropriate temperature levels to meet the controller's set point conditions.

The humidity in environmentally-controlled enclosure 10 is maintained by air humidifying device 54, which treats the air from floor airflow channel 62 before recirculation. A sensor located in ceiling airflow channel 60 may be used to set appropriate humidity levels to meet the system's set point conditions.

The pressure in environmentally-controlled enclosure 10 is maintained by controlling the amount of air that is drawn into supply air conditioning unit 46. This air, as noted above, combines with a certain amount of the recirculating air stream to maintain a constant airflow through the enclosure. Pressure gauges may be used in conjunction with a controller to meet set point conditions.

Referring now to FIGS. 1B, 2A, and 2B, processing tool 72 can be placed in workspace 12 for operation in the controlled, clean room environment, provided by enclosure 10. Examples of processing tool 72 include test equipment and metrology tools. Processing tool 72 may also be any semiconductor processor. In accordance with the present invention, processing tool 72 has a footprint that can fit in workspace 12 and be operational. In one embodiment, the width of processing tool 72 can be about 1,500 mm, the length about 3,000 mm, and the height about 2,000 mm. The support equipment required to operate processing tool 72 must also have a total footprint which can fit onto vehicle 13. In one example, processing tool 72 is a Rapid Thermal Processor of the type disclosed and described in commonly assigned U.S. patent application Ser. No. 09/451,494, filed Nov. 30, 1999, which is herein incorporated by reference for all purposes. The rapid thermal processor provides a heating apparatus for isothermally distributing a temperature across the surface of a semiconductor device or wafer during processing. In one embodiment, a chamber is provided defining a cavity, which is configured to receive a single semiconductor wafer. A plurality of resistive heating elements are provided and advantageously arranged in the cavity. Preferably, the heating elements are disposed across the chamber and are aligned in close proximity to one another so as to provide an even heating temperature distribution. Advantageously, the resistive heating elements may be positioned above and below the wafer to provide dual-sided heating. It should be understood that many of the operational parameters described above with regard to the processing support equipment (e.g. power supply 52, process gases 74, cooling water 48, pump system 50, etc.) are configured to be used with the Rapid Thermal Processor described above, or a similarly designed processor.

Figure 3B:
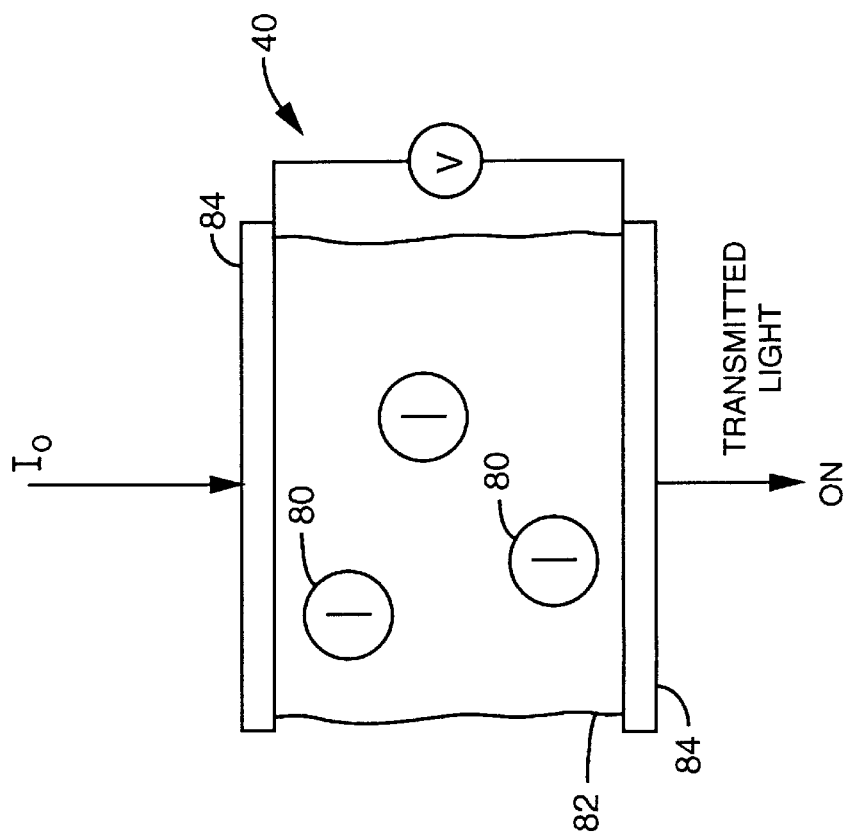
FIGS. 3A and 3B illustrate an embodiment of the PDLC window of the present invention.
Figure 3A:
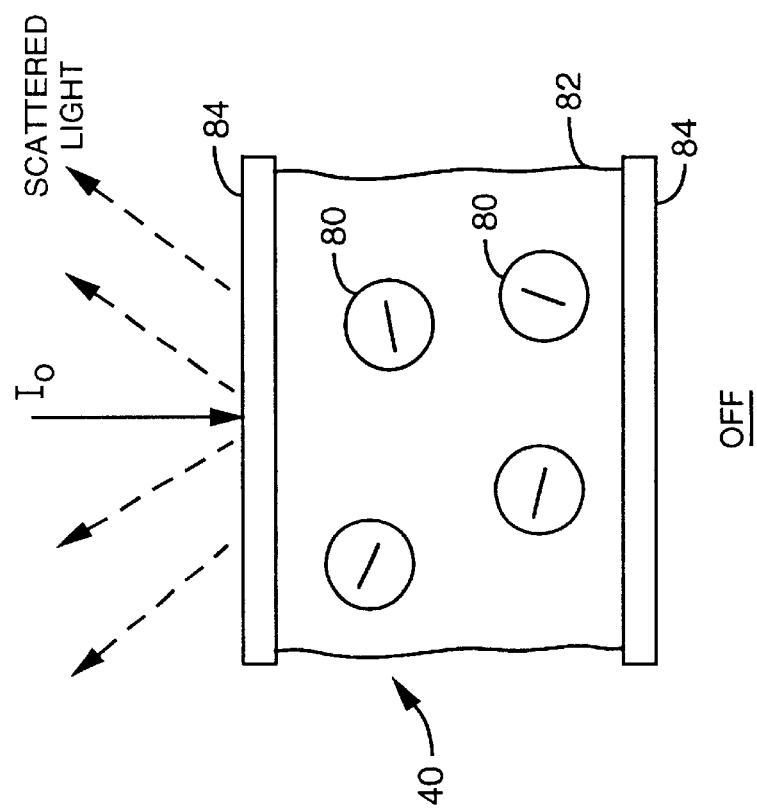

FIG. 1A illustrates viewing mechanism 40, which can be formed into a sidewall of enclosure 10. Viewing mechanism 40 allows visual access to workspace 12 from the outside of trailer housing 43, such that demonstrations can be made of the operation of processing tool 72. Viewing mechanism 40 is large enough to completely view workspace 12 from outside of enclosure 10 for demonstration purposes. In one embodiment, viewing mechanism 40 is a window of shatter-proof, tempered glass, structurally supported to prevent breaking under pressure. The glass may be made thicker or may be supported by a variety of inner and outer window frameworks to compensate for any differences in pressure between the interior and exterior of enclosure 10. It should be noted that a variety of modifications may be necessary to ensure viewing mechanism 40 is capable of withstanding pressure differences, all of which are well-know modifications in the window industry. One example of a suitable viewing mechanism 40 is Model UMU Glass 5t, available from Nippon Sheet Glass Co., Japan. In an alternative embodiment, viewing mechanism 40 can be a simple plastic window, also structurally supported or made thicker to withstand pressure differences, thus allowing visual access at all times. In another embodiment, viewing mechanism 40 can be a polymer dispersed liquid crystal (PDLC) window 41. In this embodiment, the PDLC operates on the principle of electrically controlled light scattering. As illustrated in FIGS. 3A and 3B, the window can include liquid crystal droplets 80 surrounded by a polymer mixture 82, which is sandwiched between two pieces of conducting glass 84. When no electricity is being applied to PDLC window 41, the liquid crystal droplets are randomly oriented, which creates an opaque state (FIG. 3A). When window 40 is opaque, workspace 12 cannot be observed from the outside. Conversely, when electricity is being applied to PDLC window 41, the liquid crystal droplets are aligned parallel to the electric field, which allows light to readily pass through and creates a transparent state (FIG. 3B). When PDLC window 41 is transparent, workspace 12 can be observed from the outside. An example of this type of PDLC window is available commercially from Polytronix, Inc., Richardson, Tex. In another embodiment, viewing mechanism 40 can be a television monitor operatively connected to a video camera transmitting images of workspace 12.

Referring once again to FIGS. 1A and 1B, preparation area 34 is proximate to workspace 12, separated by access door unit 30. Preparation area 34 may be used as a gowning area and may include gown hangers, clean room chamber supplies, and any other needed equipment.

Entrance area 36 is next to preparation area 34, separated by access door unit 28. In one embodiment of the present invention, entrance area 36 is the first environmentally-controlled area upon entering enclosure system 5 from the outside. In this embodiment, an air shower in conjunction with filtration devices 56 may be used as a first purging process for quickly removing contaminants brought in from outside of the environmentally-controlled area. In other embodiments, entrance area 36 may not be environmentally controlled. In one embodiment, the width of entrance area 36 is about 2,900 mm, the length about 1,600 mm, and the height about 2,300 mm. Entrance area 36 may include a shoe case and any other needed equipment. Access door unit 26 is used to enter entrance area 36.

Figure 4:
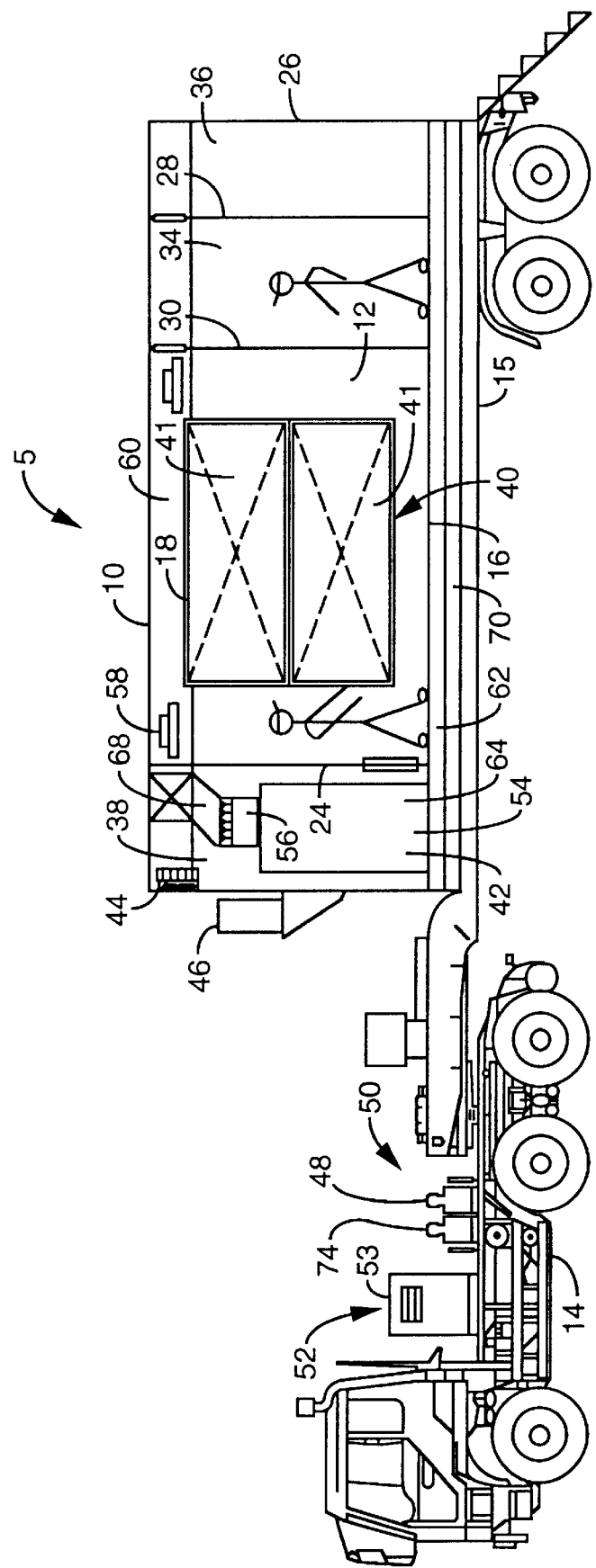
FIG. 4 is a simplified elevation view of another embodiment of the portable environmentally-controlled enclosure system of the present invention.

FIG. 4 shows an alternative embodiment of truck 14 and trailer 15 of the present invention. In this embodiment, the bed of trailer 15 is above the wheel line (no step down), which may be a useful embodiment in countries with higher height allowances for trucks and trailers.

Figures 5, 6:
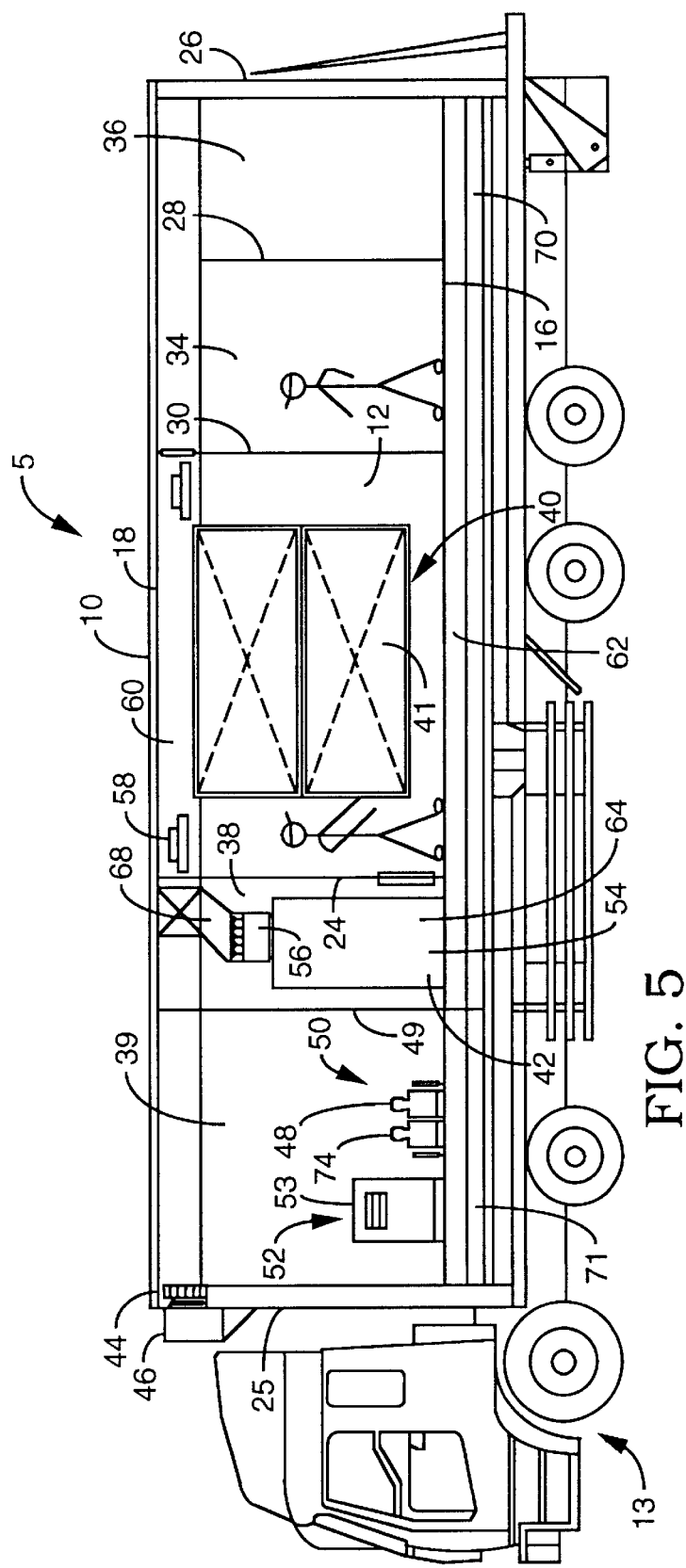
FIG. 5 is a simplified elevation view of an embodiment of the portable semiconductor clean room system with enclosed flat-bed truck.
FIG. 6 is a schematic view of the method of transporting the environmentally-controlled enclosure of this invention to various locations, and a schematic view of the method of demonstrating a semiconductor processing tool in the environmentally-controlled enclosure at various locations.

FIG. 5 shows yet another embodiment of the invention where vehicle 13 may be a fully enclosed flat-bed truck. In FIG. 5, equipment space 38 is defined by wall unit 49, wall unit 24, and the flat bed truck walls. Front equipment space 39 is next to equipment space 38, separated by wall unit 49. Front equipment space 39 is defined by wall unit 25, wall unit 49, and the flat bed truck walls. In this embodiment, equipment space 38 houses recirculating air conditioning unit 42, particle filtration device 56, and return air duct 68. Equipment space 39 houses power supply 52, process gases 74, cooling water 48, pump system 50, and supply air fan 44. Supply air conditioning unit 46 is mounted external to wall unit 25. In other embodiments, equipment enclosures 38 and 39 may house different combinations of the processing support equipment, as necessary. Also in this alternative embodiment, separate air suspension devices are mounted on the flat-bed to stabilize the entire enclosure system 5 and support equipment. Generator 53 and pump system 50 with process gases 74 and cooling water 48 are located on an air suspension device 71. Environmentally-controlled enclosure 10, housing processing tool 72, is mounted on separate air suspension device 70 to insulate enclosure 10 from external vibration and to provide greater stability.

FIG. 6 shows a method for transporting an environmentally-controlled enclosure system from one location to another, and a method for demonstrating a semiconductor processing tool in an environmentally-controlled enclosure at various locations. Environmentally-controlled enclosure 10 is a fully functional clean room, providing workspace 12 for semiconductor wafer processing and housing semiconductor processing tool 72. Enclosure 10 is transported from a first location to a second location by vehicle 13 for on-site demonstrations or to provide temporary clean room workspace. In one embodiment, vehicle 13 can include a truck and trailer transporting enclosure 10. In another embodiment, vehicle 13 can include a flat bed truck transporting enclosure 10.

After arriving at the second location, usually a demonstration or work site, environmentally-controlled enclosure system 5 may be activated to start the clean room process of purging. workspace 12 of contaminated air. The clean room is fully functional at any time once enclosure system 5 is fabricated. The purging process may be started at any time during transport or at the first location, but starting the purging process after arriving at the second location can be more cost-effective. Once the desired temperature, pressure, humidity, and particulate levels are reached, semiconductor processing tool 72 can be activated and wafers may be processed. Workspace 12 can then be viewed from a position outside of environmentally-controlled enclosure 10 through viewing mechanism 40, such as a PDLC window, a simple glass or plastic window, or a television monitor operatively connected to a camera, such that the operation of semiconductor processing tool 72 may be demonstrated to viewers outside of enclosure 10.

While the principles of the invention have been described in connection with specific apparatus, it is to be understood that this description is not a limitation on the scope of the invention.

What is claimed is:

1. A portable enclosure system comprising:

an environmentally-controlled enclosure including a workspace for semiconductor wafer processing;

a plurality of processing components for conducting semiconductor wafer processing in said workspace including a power supply, a pump system, and a plurality of environmental control devices; and a vehicle for transporting said environmentally-controlled enclosure and said plurality of processing components, said environmentally-controlled enclosure configured to be operationally functional with said plurality of processing components for the capability to perform semiconductor wafer processing on said vehicle.

2. The system of claim 1, wherein said processing components comprise a rapid thermal processor.

3. The system of claim 1, wherein said environmentally-controlled enclosure comprises a viewing mechanism for allowing visual access to the inside of the environmentally-controlled enclosure.

4. The system of claim 3, wherein said viewing mechanism is selected from the group consisting of a liquid crystal window, glass window, plastic window, and television monitor operatively coupled to a camera.

5. The system of claim 1, wherein said power supply comprises a generator supplying between about 15 kilowatts and about 50 kilowatts.

6. The system of claim 1, wherein said environmental control devices are taken from the group consisting of an air conditioning device, an air humidifying device, a particle filtration device, and an air circulation device.

7. The system of claim 1, wherein said pump system circulates process gases selected from the group consisting of non-flammable gases, non-toxic gases, and inert gases.

8. The system of claim 1, wherein said pump system circulates process cooling water.

9. The system of claim 1, wherein said vehicle comprises a truck and trailer arrangement, said trailer having at least one air suspension device for dampening vibrations.

10. A transportation system comprising:

an environmentally-controlled enclosure defining a workspace, including a semiconductor processing tool disposed in said workspace;

a power supply operably coupled to said environmentally-controlled enclosure to provide power for conducting a semiconductor process in said semiconductor processing tool;

a pump system operably coupled to said environmentally-controlled enclosure which includes at least one pump configured to circulate process gases to and from said processing tool and at least one pump configured to circulate process cooling water to and from said processing tool;

a viewing mechanism formed on a sidewall of said environmentally-controlled enclosure allowing visual access to said workspace from outside of said environmentally-controlled enclosure; and a vehicle for transporting said environmentally-controlled enclosure from a first location to a second location, said semiconductor processing tool configured to be operationally functional on said vehicle.

11. The system of claim 10, wherein said viewing mechanism is selected from the group consisting of a liquid crystal window, glass window, plastic window, and television monitor operatively coupled to a camera.

12. The system of claim 10, wherein said power supply comprises a generator supplying between about 15 kilowatts and about 50 kilowatts.

13. The system of claim 10, wherein said plurality of environmental control devices includes an air conditioning unit, an air humidifying device, a HEPA filter, and an air circulation fan.

14. The system of claim 10, wherein said vehicle comprises a truck and trailer, said trailer having at least one air suspension device for dampening vibrations.

15. A transportation system comprising:

an environmentally-controlled enclosure defining a workspace, including a semiconductor processing tool operably coupled to a plurality of processing tool components including a power supply, a pump system and a plurality of environmental control devices;

a vehicle for transporting said environmentally-controlled enclosure from a first location to a second location, said semiconductor processing tool configured to be operationally functional with said plurality of processing tool components while said environmentally-controlled enclosure is disposed on said vehicle; and at least one air suspension device mounted on said vehicle for dampening vibrations.

16. A method for demonstrating a semiconductor processing tool, said method comprising:

providing an environmentally-controlled enclosure defining a workspace, said workspace having a semiconductor processing tool disposed therein;

transporting said environmentally-controlled enclosure including said semiconductor processing tool and a plurality of processing tool components on a vehicle with a power supply and pump system from a first location to a second location, said processing tool components configured to allow said environmentally-controlled enclosure to be operationally functional with said semiconductor processing tool while disposed on said vehicle; and processing a semiconductor wafer in said workspace at said second location, said environmentally-controlled enclosure, said processing tool and said processing tool components configured to remain on said vehicle during said processing.

* * * * *